United States Patent
Ishihara et al.

(10) Patent No.: US 8,390,549 B2
(45) Date of Patent: Mar. 5, 2013

(54) ORGANIC LUMINESCENT DISPLAY DEVICE

(75) Inventors: Shingo Ishihara, Mito (JP); Tsukuru Ohtoshi, Hanno (JP)

(73) Assignees: Hitachi Displays, Ltd., Chiba (JP); Canon Kabushiki Kaisha, Tokyo (JP)

( * ) Notice: Subject to any disclaimer, the term of this patent is extended or adjusted under 35 U.S.C. 154(b) by 559 days.

(21) Appl. No.: 12/647,025

(22) Filed: Dec. 24, 2009

(65) Prior Publication Data
US 2010/0164842 A1 Jul. 1, 2010

(30) Foreign Application Priority Data
Dec. 26, 2008 (JP) ................................. 2008-332005

(51) Int. Cl.
*G09G 3/32* (2006.01)
(52) U.S. Cl. ............... 345/87; 345/32; 345/107; 345/76
(58) Field of Classification Search ..................... 345/32, 345/76, 83, 85, 87–88, 102, 107
See application file for complete search history.

(56) References Cited

U.S. PATENT DOCUMENTS
2005/0162355 A1 * 7/2005 Yamazaki ....................... 345/76
2008/0218461 A1 * 9/2008 Sugita et al. ..................... 345/88
2008/0252617 A1 * 10/2008 Nakamura et al. ............ 345/175

FOREIGN PATENT DOCUMENTS
JP 2007-141728 6/2007

\* cited by examiner

*Primary Examiner* — Joseph Feild
*Assistant Examiner* — Andrew Sasinowski
(74) *Attorney, Agent, or Firm* — Antonelli, Terry, Stout & Kraus, LLP.

(57) ABSTRACT

Organic luminescent elements forming an R sub-pixel, a G sub-pixel, and a B sub-pixel are formed of lower electrodes (3, 4, and 5), hole-transporting layers (7, 8, and 11), luminescent layers (9, 12, and 14), electron-transporting layers (10, 13, and 15), and an upper electrode (16), and each of the organic luminescent elements optimizes an optical interference condition. A dielectric alternate laminated film (17) is formed on the upper electrode (16), and forms a micro-resonator with each of the lower electrodes. The micro-resonator structure raises the directivity of a radiation pattern, and improves the light extraction efficiency of each of the organic luminescent elements. A narrow radiation pattern is alleviated by a view angle-controlling layer (19) formed on the dielectric alternate laminated film (17) so as to broaden until a perfectly diffusing surface radiation pattern. Consequently, the light extraction efficiency can be improved in an organic luminescent display device.

12 Claims, 5 Drawing Sheets

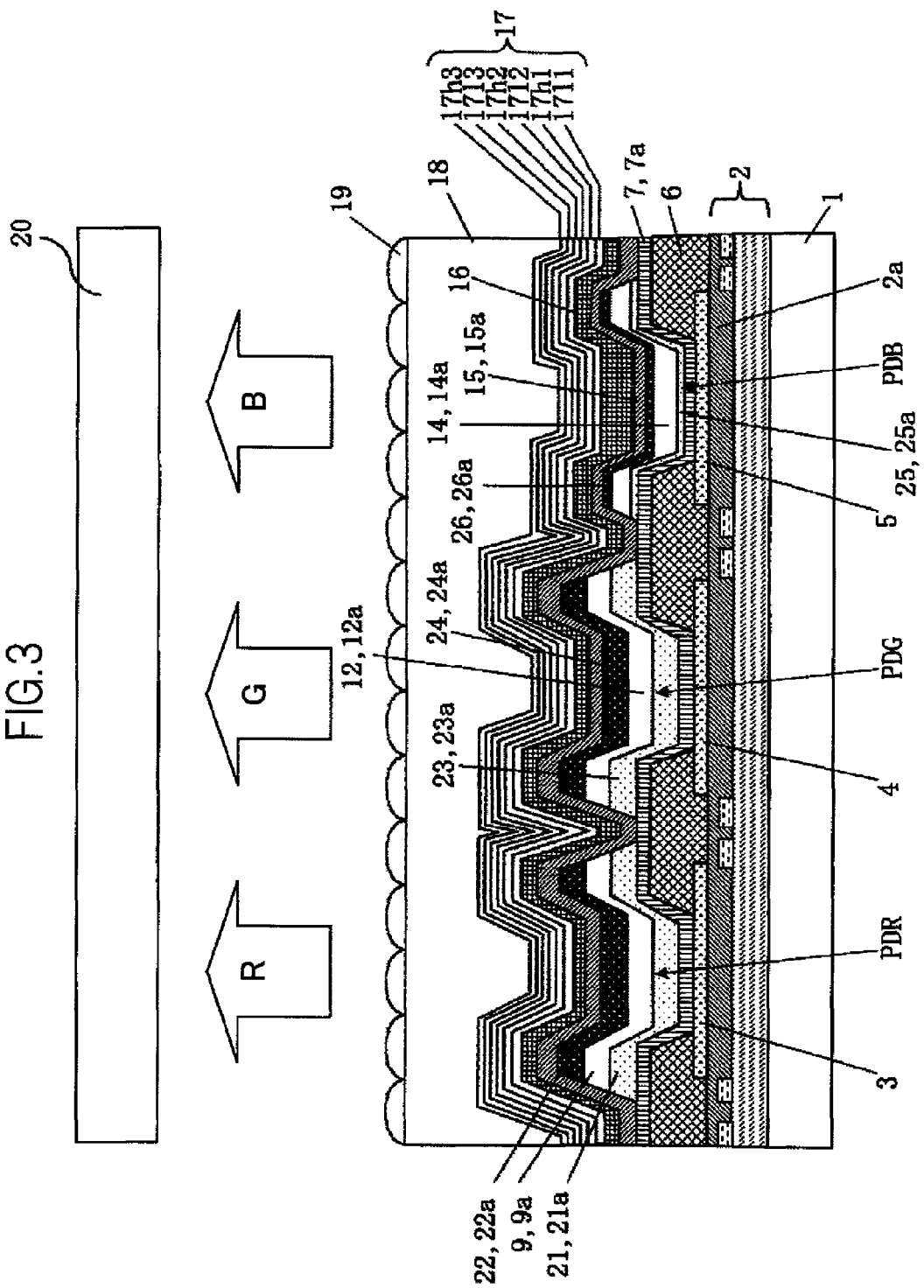

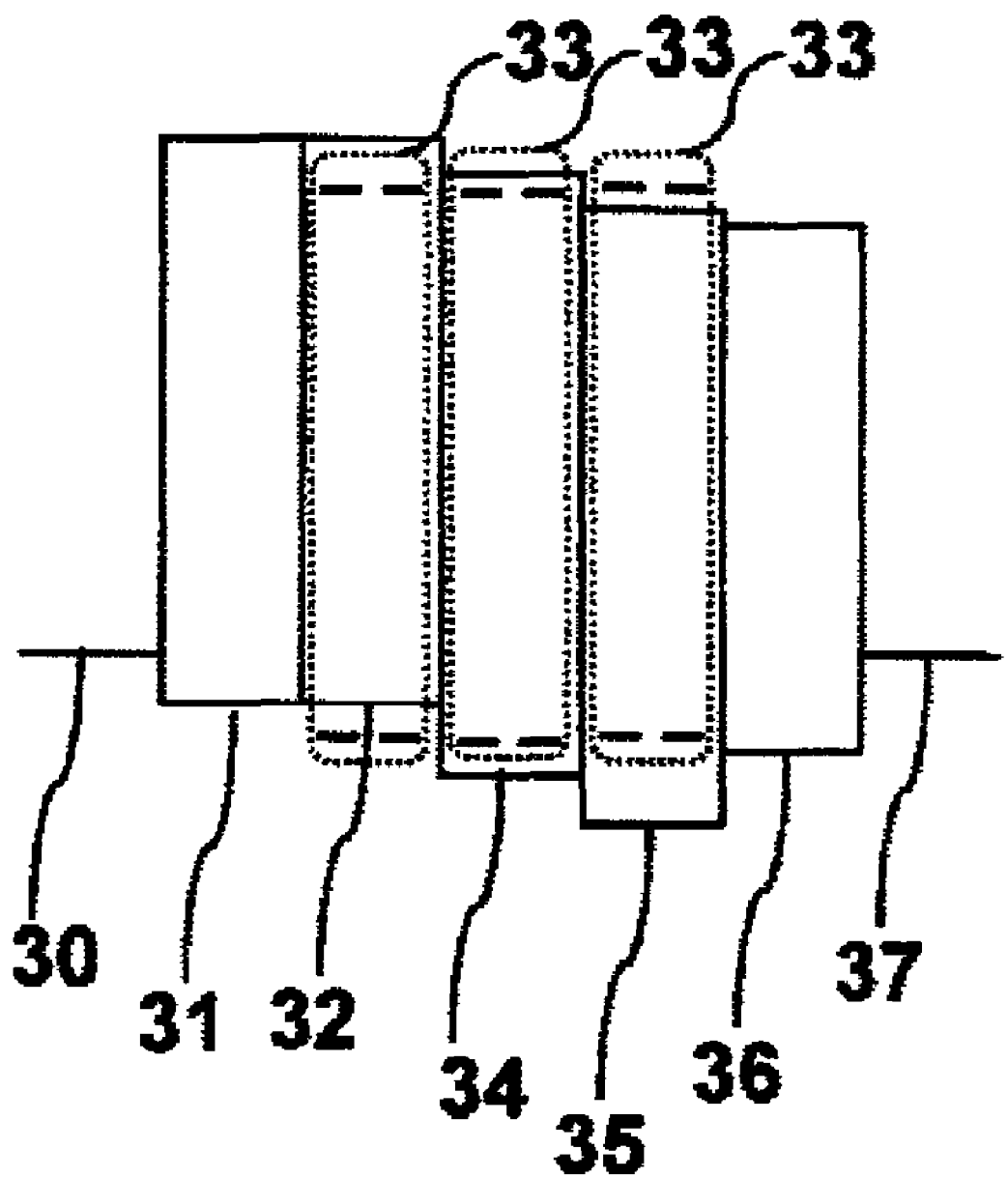

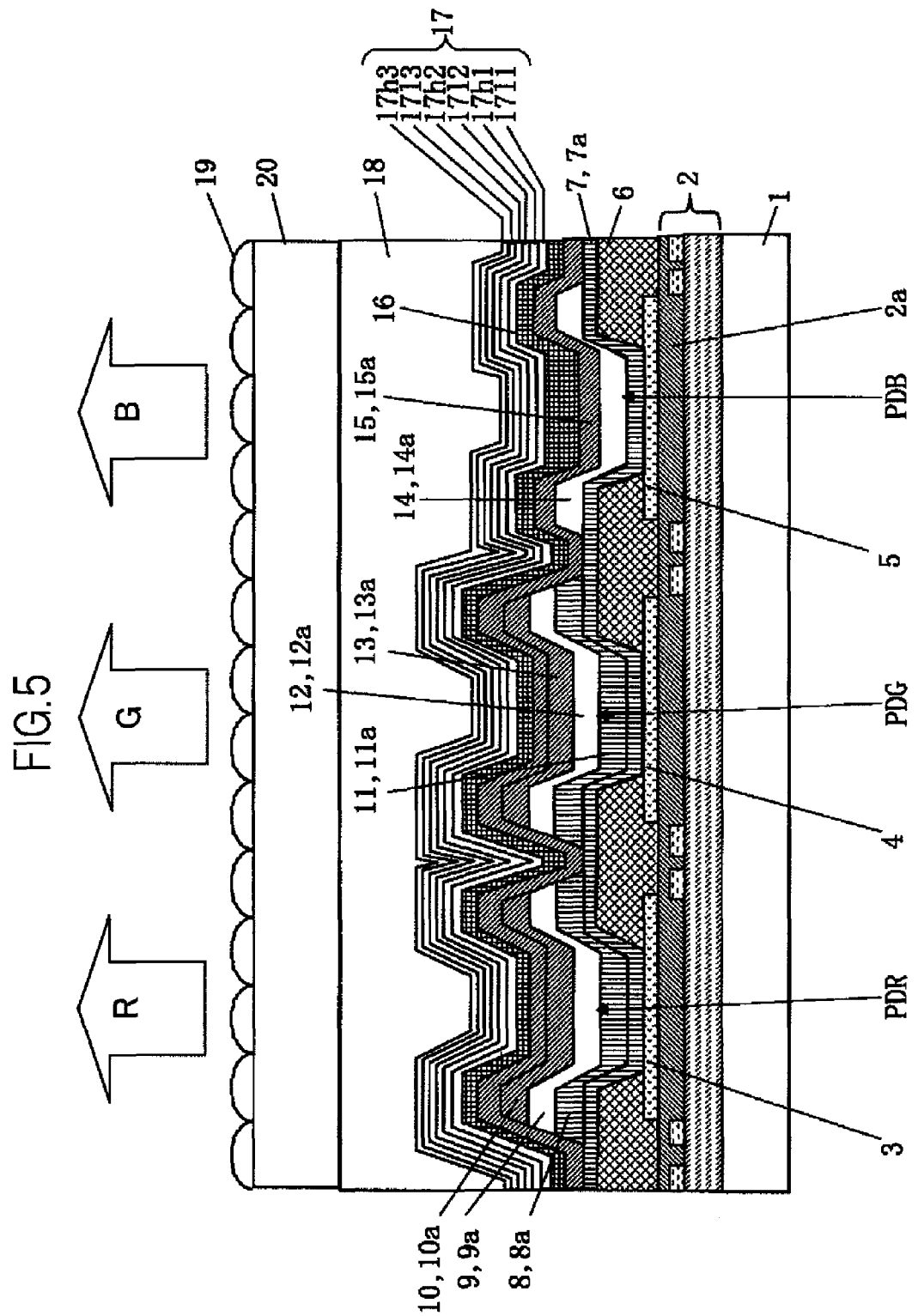

ORGANIC LUMINESCENT DISPLAY DEVICE

CROSS-REFERENCE TO RELATED APPLICATION

The present application claims priority from Japanese application JP2008-332005 filed on Dec. 26, 2008, the content of which is hereby incorporated by reference into this application.

BACKGROUND OF THE INVENTION

1. Field of the Invention

The present invention relates to an organic luminescent display device, and more specifically, to a technology effective when applied to a top emission-type organic luminescent display device.

2. Description of the Related Art

Organic electroluminescence elements (hereinafter, referred to as "organic luminescent elements") capable of spontaneously emitting light are expected to find applications in thin display devices and lighting devices for liquid crystal display devices.

An organic luminescent display device is formed of multiple organic luminescent elements forming pixels on a substrate, and a driver layer for driving the organic luminescent elements. The organic luminescent elements each have a structure in which multiple organic layers are sandwiched between a lower electrode and an upper electrode. The multiple organic layers are formed of at least a transporting layer for transporting a hole, a transporting layer for transporting an electron, and a luminescent layer in which the hole and the electron recombine. When a voltage is applied between both the electrodes, a hole and an electron injected from the electrodes recombine in the luminescent layer to emit light.

An improvement in efficiency of each of the organic luminescent elements is needed for reducing the power consumption of the organic luminescent display device. Light emitted from the luminescent layer of each organic luminescent element is exited toward an air layer. The refractive index of a general organic luminescent layer is around 1.8. Meanwhile, the refractive index of the air layer is 1. Accordingly, without exception, a total reflection interface exists, and light beams that propagate through the inside of each organic luminescent element exist. In the case of, for example, a top emission structure using an upper transparent electrode, total reflection light beams exist at an interface between the upper transparent electrode and the air layer, and about 80% of the light beams propagate through the inside of the organic luminescent element so as to be responsible for a reduction in efficiency of the element.

Japanese Patent Application Laid-open No. 2007-141728 discloses a structure in which a light-scattering layer is provided on an upper transparent electrode. Light beams to be totally reflected at an interface between the upper transparent electrode and the light-scattering layer are scattered so as to be taken in the air layer. By the method, however, even light beams that are not intrinsically scattered are scattered, and hence a light extraction effect may be at most about 1.5 times as high as that described above. That is, about 70% of the light beams propagate through the inside of the organic luminescent element.

SUMMARY OF THE INVENTION

An object of the present invention is to provide a technology by which the light extraction efficiency of each of organic luminescent elements can be improved in an organic luminescent display device using the organic luminescent elements.

A brief summary of representative examples of the invention disclosed in the present application is as described below.

In the present invention, an organic luminescent display device including multiple organic luminescent elements having different luminescent colors, in which: the organic luminescent elements each have a lower electrode, an upper electrode provided on the lower electrode, and a luminescent layer provided between the lower electrode and the upper electrode; a dielectric alternate laminated film obtained by alternately laminating dielectric films made of at least two kinds of materials is formed on the upper electrode; the dielectric alternate laminated film has a high reflectivity for a center wavelength in each of the luminescent colors; and a view angle-controlling layer is provided on the dielectric alternate laminated film.

Further, the dielectric alternate laminated film include a dielectric film made of a first dielectric material and another dielectric film made of a second dielectric material having a lower refractive index than a refractive index of the first dielectric material.

Specifically, the dielectric alternate laminated film has at least one first laminated film obtained by superimposing a layer made of the first dielectric material having an optical length equal to a quarter of a center wavelength $\lambda_G$ of green light emission and a layer made of the second dielectric material having an optical length equal to a quarter of the center wavelength $\lambda_G$ of the green light emission, and at least one second laminated film obtained by superimposing a layer made of a third dielectric material having one of an optical length equal to a center wavelength $\lambda_B$ of blue light emission and an optical length equal to three quarters of a center wavelength $\lambda_R$ of red light emission, and a layer made of a fourth dielectric material having one of an optical length equal to three quarters of the center wavelength $\lambda_B$ of the blue light emission and an optical length equal to one half of the center wavelength $\lambda_R$ of the red light emission.

Further, the lower electrode has a function of reflecting light emitted from the luminescent layer, and the upper electrode has a function of transmitting the light emitted from the luminescent layer.

Further, a micro-resonator structure formed of the lower electrode and the dielectric alternate laminated film desirably has a finesse in a range of 3.7 or more to 7 or less.

Further, it is desired that the luminescent layer include a luminescent layer to which a host material and an emitter that determines a luminescent color are added, each of an electron-blocking layer and a hole-blocking layer be formed in both sides of the luminescent layer so that the luminescent layer is sandwiched; and the electron-blocking layer be made of a hole-transporting material and a first dopant, and the hole-blocking layer be made of an electron-transporting material and a second dopant.

Further, it is desired that a difference between an ionization potential of the hole-transporting material of which the electron-blocking layer is made and an ionization potential of the first dopant be 0.1 eV or less, a difference between an electron affinity of the first dopant and an electron affinity of the hole-transporting material be 0.1 eV or more, a difference between an ionization potential of the electron-transporting material of which the hole-blocking layer is made and an ionization potential of the second dopant be 0.1 eV or more, and a difference between an electron affinity of the electron-transporting material and an electron affinity of the second dopant be 0.1 eV or more.

Further, it is desired that the view angle-controlling layer be formed of multiple microlenses.

Further, it is desired that an adhesive be provided between the dielectric alternate laminated film and the view angle-controlling layer, and, in particular, the adhesive include a photocurable resin.

Further, the organic luminescent elements are formed on a first substrate, and the view angle-controlling layer may be formed on a second substrate different from the first substrate.

A brief description of an effect exerted by the representative examples of the invention disclosed in the present application is as described below.

As described above, according to the present invention, when the organic luminescent elements having multiple luminescent colors are provided with a reflection mirror formed of the common dielectric alternate laminated film, emitted light adopts an internal radiation pattern having a smaller angle than the critical angle of an interface at which total reflection occurs. As a result, the light extraction efficiency of each of the organic luminescent elements improves. In contrast, when the view angle-controlling layer is provided on the dielectric alternate laminated film, a radiation pattern having high directivity is alleviated, and hence a radiation pattern proper for the display device is obtained.

BRIEF DESCRIPTION OF THE DRAWINGS

In the accompanying drawings:

FIG. 3 is a sectional view of a pixel of an organic luminescent display device according to Example 2 of the present invention;

FIG. 4 is a view illustrating the energy levels of an organic luminescent element; and FIG. 5 is a sectional view of a pixel of an organic luminescent display device according to Example 3 of the present invention.

DETAILED DESCRIPTION OF THE INVENTION

Figure 1:
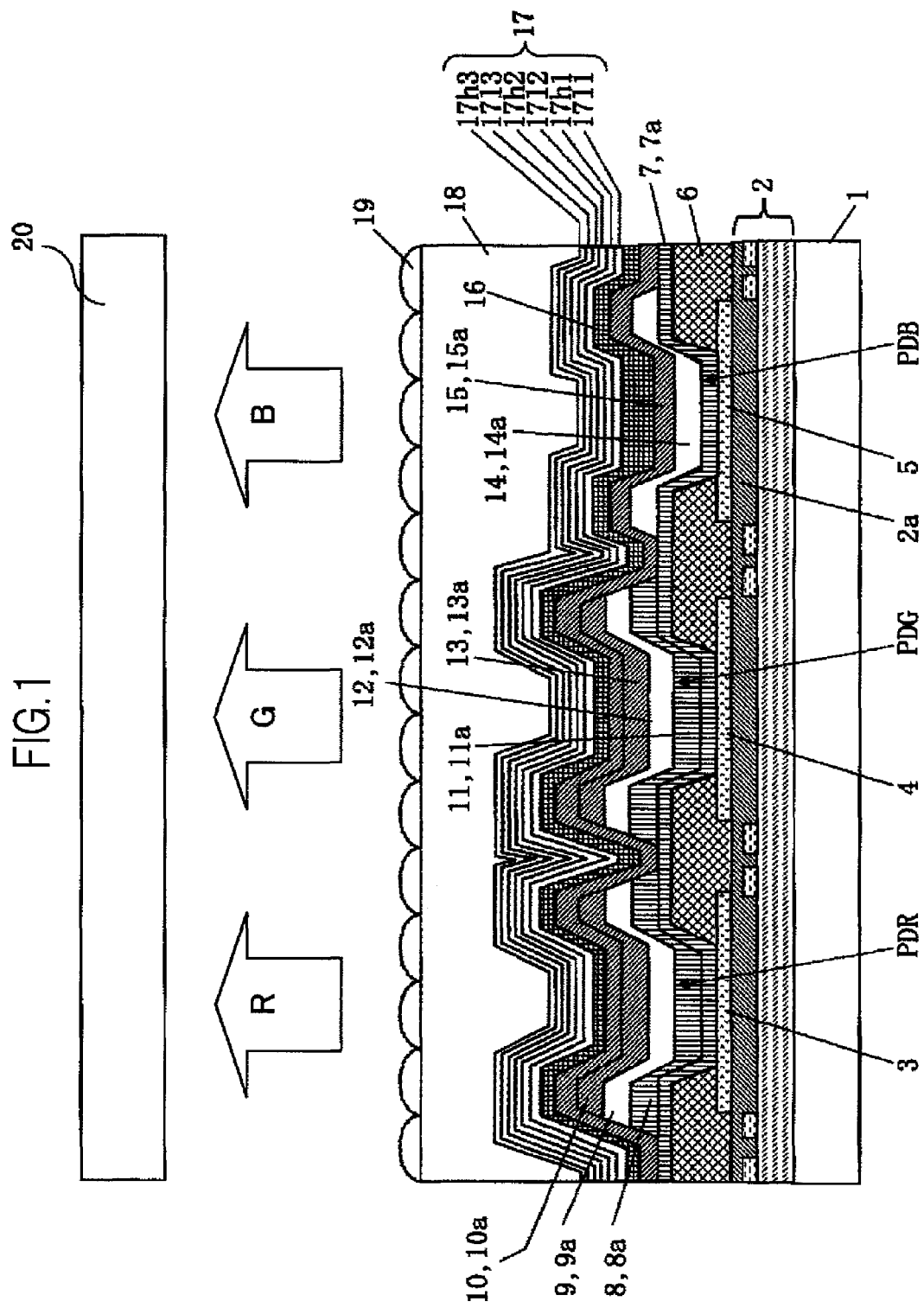
FIG. 1 is a sectional view of a pixel of an organic luminescent display device according to Example 1 of the present invention.

Hereinafter, examples of the present invention are described in detail with reference to drawings. It should be noted that substances having the same functions in all figures for describing the examples of the invention are provided with the same reference symbols, and repeated descriptions of the substances are omitted.

Hereinafter, an organic luminescent element in the present invention adopts the following structure. That is, the element is formed of a substrate, a lower electrode, a first injecting layer, a first transporting layer, a luminescent layer, a second transporting layer, a second injecting layer, an upper electrode, and a protective layer or a sealing substrate (counter substrate) laminated in the stated order.

Two combinations are available for the lower electrode and the upper electrode. First, a constitution in which the lower electrode is an anode and the upper electrode is a cathode is available. In this case, the first injecting layer is a hole-injecting layer and the first transporting layer is a hole-transporting layer. In addition, the second transporting layer is an electron-transporting layer and the second injecting layer is an electron-injecting layer.

The other combination is a constitution in which the lower electrode is the cathode and the upper electrode is the anode.

In this case, the first injecting layer is the electron-injecting layer and the first transporting layer is the electron-transporting layer. In addition, the second transporting layer is the hole-transporting layer and the second injecting layer is the hole-injecting layer.

The above structure without the first injecting layer or the second injecting layer is also available. In addition, the first transporting layer or the second transporting layer may also have a function of the luminescent layer.

A first carrier-blocking layer may be provided between the first transporting layer and the luminescent layer, and a second carrier-blocking layer may be provided between the luminescent layer and the second transporting layer. When the first transporting layer is the hole-transporting layer, the first carrier-blocking layer is an electron-blocking layer and the second carrier-blocking layer is a hole-blocking layer. In addition, when the first transporting layer is the electron-transporting layer, the first carrier-blocking layer is the hole-blocking layer and the second carrier-blocking layer is the electron-blocking layer.

A desirable combination of the upper electrode and the lower electrode is such that one of the electrodes has transmissibility for emitted light (function of transmitting light emitted from the luminescent layer) and the other electrode has reflectivity for the emitted light (function of reflecting the light emitted from the luminescent layer). In the case, the light is extracted from the electrode having transmissibility, and hence the electrode is referred to as "light extraction electrode". On the other hand, the electrode having reflectivity is referred to as "reflecting electrode".

When the upper electrode is the light extraction electrode, the above structure is referred to as "top emission structure". On the other hand, when the lower electrode is the light extraction electrode, the structure is referred to as "bottom emission structure".

The substrate used here can be selected from a wide variety of materials as long as the materials are insulators. Specifically, there may be used an inorganic material such as glass and an alumina sintered article, various insulating plastics such as a polyimide film, a polyester film, a polyethylene film, a polyphenylene sulfide film, and a polyparaxylene film.

In addition, no problem arises even when the substrate is made of a metal material as long as any one of the above insulating materials is formed on the surface of the substrate. Specific examples of the material for the substrate include, but are not limited to, stainless steel, aluminum, copper, and an alloy containing any one of the above metals.

The anode used here is desirably a conductive film having a work function large enough to improve the efficiency of the injection of holes. A material for the anode is specifically, for example, gold or platinum, but is not limited to these materials.

Alternatively, the anode may be a binary system such as indium tin oxide (ITO), indium zinc oxide (IZO), or indium germanium oxide, or may be a ternary system such as indium tin zinc oxide. Alternatively, the anode may have composition mainly made of tin oxide, zinc oxide, or the like as well as indium oxide. In addition, in the case of ITO, composition containing 5 to 10 wt % of tin oxide with respect to indium oxide is used in most cases. A method of producing an oxide semiconductor is, for example, a sputtering method, an EB deposition method, or an ion plating method.

An ITO film has a work function of 4.6 eV and an IZO film has a work function of 4.6 eV. Each of the work functions can be increased to about 5.2 eV by, for example, UV/ozone irradiation or an oxygen plasma treatment.

The ITO film is brought into a polycrystalline state when the film is produced by the sputtering method under such a condition that the temperature of the substrate is increased to about 200° C. Because the film in the polycrystalline state has bad surface smoothness owing to crystal grains, its surface is desirably polished. Alternatively, it is desirable that the ITO film formed in an amorphous state be heated so as to be brought into the polycrystalline state.

In addition, providing the hole-injecting layer obviates the need for using a material having a large work function for the anode, and hence an ordinary conductive film suffices.

Specifically desired are: metals such as aluminum, indium, molybdenum, and nickel; alloys including those metals; and inorganic materials such as polysilicon, amorphous silicon, tin oxide, indium oxide, and indium tin oxide (ITO).

In addition, when the anode is used as the reflecting electrode, a laminated film obtained by forming a transparent conductive film on the reflecting electrode as a metal film is also possible. Each layer is desirably made of any one of the above materials. Of course, the material for each layer is not limited to those materials, and two or more kinds of those materials can be used in combination.

In addition, the anode is desirably made of an organic material such as polyaniline or polythiophene, or a conductive ink by using an application method by which the anode can be formed according to a simple process. Of course, the material for the anode is not limited to those materials, and two or more kinds of those materials can be used in combination.

The hole-injecting layer used here is desirably made of a material having a proper ionization potential for lowering an injection barrier between the anode and the hole-transporting layer. In addition, the layer desirably serves a function to fill in the surface asperities of an underlayer. Specific examples of the material include, but are not limited to, copper phthalocyanine, a starburst amine compound, polyaniline, polythiophene, vanadium oxide, molybdenum oxide, ruthenium oxide, and aluminum oxide.

The hole-transporting layer used here serves to transport a hole and to inject the hole into the luminescent layer. Accordingly, the layer is desirably made of a hole transportable material having a high hole mobility. In addition, it is desirable that the material be chemically stable. In addition, the material desirably has a small ionization potential. In addition, the material desirably has a small electron affinity. In addition, the material desirably has a high glass transition temperature. Specifically desired are N,N'-bis(3-methylphenyl)-N,N'-diphenyl-[1,1'-biphenyl]-4,4' diamine (TPD), 4,4'-bis[N-(1-naphthyl)-N-phenylamino]biphenyl (α-NPD), 4,4',4''-tri(N-carbazolyl)triphenylamine (TCTA), 1,3,5-tris[N-(4-diphenylaminophenyl)phenylamino]benzene (p-DPA-TDAB), 4,4',4''-tris(N-carbazole)triphenylamine (TCTA), 1,3,5-tris[N,N-bis(2-methylphenyl)-amino]-benzene (o-MTDAB), 1,3,5-tris[N,N-bis(3-methylphenyl)-amino]-benzene (m-MTDAB), 1,3,5-tris[N,N-bis(4-methylphenyl)-amino]-benzene (p-MTDAB), 4,4',4''-tris[1-naphthyl(phenyl)amino]triphenylamine (1-TNATA), 4,4',4''-tris[2-naphthyl(phenyl)amino]triphenylamine (2-TNATA), 4,4',4''-tris[biphenyl-4-yl-(3-methylphenyl)amino]triphenylamine (p-PMTDATA), 4,4',4''-tris[9,9-dimethylfluoren-2-yl(phenyl)amino]triphenyl amine (TFATA), 4,4',4''-tris(N-carbazoyl)triphenylamine (TCTA), 1,3,5-tris-[N-(4-diphenylaminophenyl)phenylamino]benzene (p-DPA-TDAB), 1,3,5-tris{4-[methylphenyl(phenyl)amino]phenyl}benzene (MTDAPB), N,N'-di(biphenyl-4-yl)-N,N'-diphenyl[1,1'-biphenyl]-4,4'-diamine (p-BPD), N,N'-bis(9,9-dimethylfluoren-2-yl)-N,N'-diphenylfluorene-2,7-diamine (PFFA), N,N,N',N'-tetrakis(9,9-dimethylfluorene-2-yl)-[1,1-biphenyl]-4,4'-diamine (FFD), (NDA) PP, and 4-4'-bis[N,N'-(3-tolyl)amino]-3-3'-dimethylbiphenyl (HMTPD). The material of the hole-transporting layer is of course not limited to those materials, and two or more kinds of those materials can be used in combination.

In addition, the hole-transporting layer is desirably formed by incorporating an oxidant into the above hole transportable material so that its barrier with the anode may be reduced or its electric conductivity may be increased. Specific examples of the oxidant include: Lewis acid compounds such as ferric chloride, ammonium chloride, gallium chloride, indium chloride, and antimony pentachloride; and electron acceptable compounds such as trinitrofluorene. Of course, the oxidant is not limited to those materials, and two or more kinds of those materials can be used in combination.

The luminescent layer used here is such a layer that an injected hole and an injected electron recombine to emit light at a wavelength inherent in a material for the layer. A host material itself of which the luminescent layer is formed may emit light, or a dopant material added in a trace amount to the host material may emit light. As specific examples of the host material, desired are a distyryl arylene derivative (DPVBi), a silole derivative (2PSP) having a benzene ring in the skeleton, an oxadiazole derivative (EM2) having triphenyl amine structures in both ends of the molecule, a perinone derivative (P1) having a phenanthrene group, an oligothiophene derivative (BMA-3T) having triphenylamine structures in both ends of the molecule, a perylene derivative (tBu-PTC), tris(8-quinolinol) aluminum, a polyparaphenylene vinylene derivative, a polythiophene derivative, a polyparaphenylene derivative, a polysilane derivative, and a polyacetylene derivative. In addition, the host material is of course not limited to those materials, and two or more kinds of those materials can be used in combination.

Next, as specific examples of the dopant material, desired are quinacridone, coumarin 6, nile red, rubrene, 4-(dicyanomethylene)-2-methyl-6-(para-dimethylaminostyryl)-4H-pyran (DCM), a dicarbazole derivative, a porphyrin platinum complex (PtOEP), and an iridium complex (Ir(ppy)3). In addition, the dopant material is of course not limited to those materials, and two or more kinds of those materials can be used in combination.

The electron-transporting layer used here has a role of transporting and injecting electrons to the luminescent layer. Therefore, the electron-transporting layer is desirably made of an electron-transporting material having a high electron mobility. Specifically desired are tris(8-quinolinol)aluminum, an oxadiazole derivative, a silole derivative, a benzothiazole zinc complex, and bathocuproine (BCP). In addition, the electron-transporting layer is of course not limited to those materials, and two or more kinds of those materials can be used in combination.

In addition, it is desired that, by incorporating a reducing agent to the above electron-transporting material, a barrier between the electron-transporting layer and the cathode is lowered or an electric conductivity is improved. Specific examples of the reducing agent include an alkali metal, an alkali earth metal, an alkali metal oxide, an alkali earth metal oxide, a rare earth metal oxide, an alkali metal halide, an alkali earth metal halide, a rare earth metal halide, and a complex made of an alkali metal and an aromatic compound. Particularly preferred alkali metals are Cs, Li, Na, and K. The reducing agent is of course not limited to those materials, and two or more kinds of those materials can be used in combination.

The electron-injecting layer used here is used for improving electron-injecting efficiency from the cathode to the electron-transporting layer. Specifically desired are lithium fluoride, magnesium fluoride, calcium fluoride, strontium fluoride, barium fluoride, magnesium oxide, and aluminum oxide. In addition, the electron-injecting layer is of course not limited to those materials, and two or more kinds of those materials can be used in combination.

The cathode used here is desirably a conductive film having a small work function for improving electron-injecting efficiency. Specific examples thereof include a magnesium-silver alloy, an aluminum-lithium alloy, an aluminum-calcium alloy, an aluminum-magnesium alloy, and metal calcium. However, the cathode is not limited to those materials.

In addition, when the above-mentioned electron-injecting layer is provided, there is no need to use a material having a low work function as a condition for the cathode, and a general metal material can be used. Specifically desired are: metals such as aluminum, indium, molybdenum, and nickel; alloys including those metals; polysilicon; and amorphous silicon.

The protective layer used here is formed on the upper electrode and has an object to prevent $H_2O$ and $O_2$ in the atmosphere from entering the upper electrode or the organic layer therebelow.

Specific examples thereof include: inorganic materials such as $SiO_2$, SiNx, and $Al_2O_3$; and organic materials such as polychloropyrene, polyethylene terephthalate, polyoxymethylene, polyvinyl chloride, polyvinylidene fluoride, cyanoethyl pullulan, polymethylmethacrylate, polysulfone, polycarbonate, and polyimide. However, the protective layer is not limited to those materials.

An organic luminescent display device according to the present invention desirably uses the above organic luminescent elements in its pixels.

The organic luminescent display device used here is a display device using the organic luminescent elements in its pixels. The organic luminescent display device is divided into a simple matrix organic luminescent display device and an active matrix organic luminescent display device.

In the simple matrix organic luminescent display device, organic layers such as the hole-transporting layer, the luminescent layer, and the electron-transporting layer are formed at each of points of intersection of multiple anode lines and multiple cathode lines, and each pixel lights up only for a selected time in a one-frame period. The selected time is a time width obtained by dividing the one-frame period by the number of anode lines.

In the active matrix organic luminescent display device, a driver element formed of two to four thin-film transistor switching elements and a capacity is connected to an organic luminescent (EL) element of which each pixel is formed so that each pixel can light up during a one-frame period. Accordingly, there is no need to improve the luminance of each organic luminescent element, and hence the lifetime of each organic luminescent element can be lengthened.

The pixels used here are the minimum units arranged in a large number longitudinally and horizontally on the screen of the display device to display characters or graphics in a display region. In addition, a sub-pixel is the minimum unit obtained by further dividing each pixel in a display device that displays colors. It is general to have a structure formed of sub-pixels for three colors, i.e., green, red, and blue colors in color image. In addition, the display region is a region where an image is displayed in the display device.

A current supply line is a wire for connecting each organic EL element and a power supply. In the active matrix organic luminescent display device, a first current supply line is a wire for connecting the power supply and the lower electrode of the organic EL element through the source and drain electrodes of a switching element. Next, a second current supply line is a wire for connecting the power supply and the upper electrode serving as a common electrode for the respective pixels.

EXAMPLE 1

An embodiment of the organic luminescent display device according to the present invention is described with reference to drawings. FIG. 1 is a sectional view of a pixel of an organic luminescent display device as Example 1 of the present invention.

In this example, an example in which the present invention is applied to a top emission-type organic luminescent display device is described.

As illustrated in FIG. 1, a driver layer 2 is formed between a glass substrate (OLED substrate) 1 and lower electrodes 3, 4, and 5 of organic luminescent elements. Although not illustrated in FIG. 1, in the driver layer 2, multiple scanning lines are arranged at a constant interval, and signal lines (video signal lines) for transmitting image information are arranged at a constant interval in such directions as to intersect the respective scanning lines. That is, the respective scanning lines and the respective signal lines are arranged in a lattice fashion, and regions surrounded by the respective scanning lines and the respective signal lines are each a display region for one pixel or one sub-pixel. Further, multiple first current supply lines connected to a power supply are arranged parallel to the signal lines on the glass substrate. The scanning lines, the signal lines, and the first current supply lines are formed on the glass substrate as wires belonging to a wiring layer through an interlayer insulating film.

Multiple organic luminescent elements which forms a pixel as the minimum unit for a color image are arranged on the upper side of the driver layer 2. The lower electrodes 3, 4, and 5 are formed so as to be of sub-pixel sizes. The organic layers including hole-transporting layers 7, 8, and 11, luminescent layers 9, 12, and 14, and electron-transporting layers 10, 13, and 15, and an upper electrode 16 are formed on the lower electrodes. The lower electrodes 3 to 5 of the organic luminescent elements belonging to each pixel are connected to the first current supply lines through a transistor as a driver element, and the upper electrode 16 of the organic luminescent elements belonging to each pixel is connected to the power supply.

In addition, the driver layer 2 for driving the organic layers of each pixel is formed on the glass substrate 1. The driver layer 2 is formed of a first transistor and a second transistor as driver elements, and a capacity. The gate electrode of the first transistor is connected to the scanning lines, the source electrode of the first transistor is connected to the signal lines, and the drain electrode of the first transistor is connected to the gate electrode of the second transistor and the lower electrode of the capacity. The drain electrode of the second transistor is connected to the upper electrode of the capacity and the first current supply lines, and the source electrode of the second transistor is connected to the lower electrodes 3 to 5.

Next, the structures of organic luminescent elements serving as a pixel are described with reference to FIG. 1. It should be noted that, in FIG. 1, reference symbol PDR represents an organic luminescent element that emits red light, reference symbol PDG represents an organic luminescent element that emits green light, and reference symbol PDB represents an organic luminescent element that emits blue light.

The lower electrodes 3 to 5 each formed of a laminated film of Ag and IZO are formed on an interlayer insulating film 2a in the driver layer 2 by employing a sputtering method. The thickness of each of the electrodes is as described below. For example, Ag has a thickness of 150 nm and IZO has a thickness of 20 nm. The lower electrodes 3 to 5 each have a function of reflecting light emitted from the luminescent layer of each organic luminescent element.

Next, an interlayer insulating film 6 is formed for hiding the edges of the lower electrodes 3 to 5. Although an acrylic insulating film is used as the interlayer insulating film 6 in this example, the film is not limited to the acrylic insulating film, and a material for the film is, for example, an organic insulating material such as polychloropyrene, polyethylene terephthalate, polyoxymethylene, polyvinyl chloride, polyvinylidene fluoride, cyanoethyl pullulan, polymethyl methacrylate, polysulfone, polycarbonate, or polyimide. In addition, an inorganic material such as $SiO_2$, $SiN_x$, or $Al_2O_3$ can also be used. In addition, a constitution in which an inorganic insulating film is laminated on an organic insulating film is also permitted. The interlayer insulating film 6 is formed to cover the peripheral portions of the lower electrodes 3 to 5 and to expose the center portions of the lower electrodes 3 to 5 in the respective organic luminescent elements.

Next, 4,4'-bis[N-(1-naphthyl)-N-phenylamino]biphenyl (hereinafter, referred to as "α-NPD") is deposited from vapor onto the lower electrodes 3 to 5 by a vacuum deposition method so that an α-NPD film 7a having a thickness of about 20 nm may be formed. The α-NPD film 7a is formed on the entire surface of a luminescent display area, and functions as the hole-transporting layer 7.

Next, the formation of organic layers in a sub-pixel having a red luminescent color (hereinafter, referred to as "R sub-pixel") (organic luminescent element PDR) is described.

An α-NPD film 8a having a thickness of about 20 nm is formed on the α-NPD film 7a by a vacuum deposition method. As described later, the formation is performed as the adjustment of an optical interference condition in the R sub-pixel. The α-NPD film 8a functions as the hole-transporting layer 8.

Then, 4,4'-N,N'-dicarbazole-biphenyl (hereinafter, referred to as "CBP") and bis[2-(2'-benzo[4,5-a]thienyl)pyridinate-N,C3']iridium(acetylacetonate) (hereinafter, referred to as "$Brp_2Ir(acac)$") are co-deposited from vapor onto the α-NPD film 8a so that a co-deposited film 9a may be formed. The deposition rate of CBP was 0.20 nm/sec and the deposition rate of $Brp_2Ir(acac)$ was 0.02 nm/sec. The co-deposited film 9a functions as the luminescent layer 9 of the organic luminescent element PDR in the R sub-pixel. In addition, $Brp_2Ir(acac)$ functions as an emitter that determines a luminescent color in the luminescent layer 9.

Tris(8-quinolinol)aluminum (hereinafter, referred to as "Alq3") is deposited from vapor onto the film by a vacuum deposition method so that an Alq3 film 10a having a thickness of about 45 nm may be formed. The Alq3 film 10a functions as the electron-transporting layer 10. In addition, the Alq3 film 10a is used for adjusting an optical interference condition. The α-NPD film 8a, the co-deposited film 9a of CBP and $Brp_2Ir(acac)$, and the Alq3 film 10a are each turned into a pattern with a precision mask having an opening pattern comparable in size to the sub-pixel.

Next, the formation of organic layers in a sub-pixel having a green luminescent color (hereinafter, referred to as "G sub-pixel") (organic luminescent element PDG) formed on the lower electrode 4 is described.

An α-NPD film 11a having a thickness of about 10 nm is formed on the α-NPD film 7a by a vacuum deposition method.

Then, CBP and an iridium complex (hereinafter, referred to as "$Ir(ppy)_3$") are co-deposited from vapor onto the α-NPD film 11a by a vacuum deposition method so that a co-deposited film 12a having a thickness of about 40 nm may be formed. The deposition rate of CBP was 0.20 nm/sec and the deposition rate of $Ir(ppy)_3$ was 0.02 nm/sec. The above co-deposited film 12a functions as the luminescent layer 12 of the luminescent element PDG in the G sub-pixel. In addition, $Ir(ppy)_3$ functions as an emitter that determines a luminescent color in the luminescent layer 12.

An Alq3 film 13a having a thickness of about 20 nm is formed on the film by a vacuum deposition method. The α-NPD film 11a and the Alq3 film 13a are used for adjusting an optical interference condition in the G sub-pixel. The α-NPD film 11a functions as the hole-transporting layer 11 and the Alq3 film 13a functions as the electron-transporting layer 13. In addition, the α-NPD film 11a, the co-deposited film 12a of CBP and $Ir(ppy)_3$, and the Alq3 film 13a are each turned into a pattern with a precision mask having an opening pattern comparable in size to the sub-pixel.

Next, the formation of organic layers in a sub-pixel having a blue luminescent color (hereinafter, referred to as "B sub-pixel") (organic luminescent element PDB) formed on the lower electrode 5 is described.

First, 9,10-di-(2-naphthyl) anthracene (hereinafter, referred to as "ADN") and 2,5,8,11-tetra-t-butylperylene (hereinafter, referred to as "TBP") are co-deposited from vapor onto the α-NPD film 7a by a vacuum deposition method so that a co-deposited film 14a having a thickness of 40 nm may be formed. The deposition rate of ADN was 0.20 nm/sec and the deposition rate of TBP was 0.01 nm/sec. The co-deposited film 14a of ADN and TBP is turned into a pattern with a precision mask having an opening pattern comparable in size to the sub-pixel. The co-deposited film 14a functions as a luminescent layer 14a of the luminescent element PDB in the B sub-pixel.

Next, an Alq3 film 15a having a thickness of 60 nm is formed on the R sub-pixel, the G sub-pixel, and the B sub-pixel by a vacuum deposition method. The Alq3 film 15a functions as the electron-transporting layer 15.

Next, a CuPc film having a thickness of 2 nm is formed on the Alq3 film 15a by a vacuum deposition method, and an IZO film having a thickness of 40 nm is formed on the film by a sputtering method. Those films are formed on the entire surface of the luminescent display area, and function as the upper electrode 16. The upper electrode 16 has a function of transmitting light emitted from the luminescent layer of each organic luminescent element.

Next, a method of forming a dielectric alternate laminated film 17 to be formed on the upper electrode 16 is described.

Here, the dielectric alternate laminated film 17 obtained by alternately laminating dielectric films made of at least two kinds of materials is formed on the upper electrode 16 of each of the R sub-pixel, the G sub-pixel, and the B sub-pixel. The dielectric alternate laminated film 17 is characterized in that the film has a high reflectivity for a center wavelength in a luminescent color, and a view angle-controlling layer is provided on the dielectric alternate laminated film 17.

In addition, the dielectric alternate laminated film 17 is formed of a laminated film made of a first dielectric material and a second dielectric material having a lower refractive index than that of the first dielectric material.

Specifically, the dielectric alternate laminated film 17 is characterized in that the film has at least one first laminated film obtained by superimposing a layer made of the first dielectric material having an optical length equal to a quarter of a center wavelength $\lambda_G$ of green light emission and a layer made of the second dielectric material having an optical length equal to a quarter of the center wavelength $\lambda_G$ of the green light emission, and at least one second laminated film obtained by superimposing a layer made of a third dielectric material having one of an optical length equal to a center wavelength $\lambda_B$ of blue light emission and an optical length equal to three quarters of a center wavelength $\lambda_R$ of red light emission, and a layer made of a fourth dielectric material having one of an optical length equal to three quarters of the center wavelength $\lambda_B$ of the blue light emission and an optical length equal to one half of the center wavelength $\lambda_R$ of the red light emission.

Hereinafter, the dielectric alternate laminated film 17 of this example is described.

Six layers of $SiO_2$ and SiNx are formed by employing an ion plating method. The layers are defined as an $SiO_2$ film 1711 having a thickness of 216 nm, an SiNx film 17h1 having a thickness of 218 nm, an $SiO_2$ film 1712 having a thickness of 87 nm, an SiNx film 17h2 having a thickness of 62 nm, an $SiO_2$ film 1713 having a thickness of 216 nm, and an SiNx film 17h3 having a thickness of 218 nm from the side of the upper electrode 16. Although the dielectric alternate laminated film 17 was produced by the ion plating method in this example, the film may be produced by a low-temperature film-forming method such as a reactive plasma method.

Figure 2:
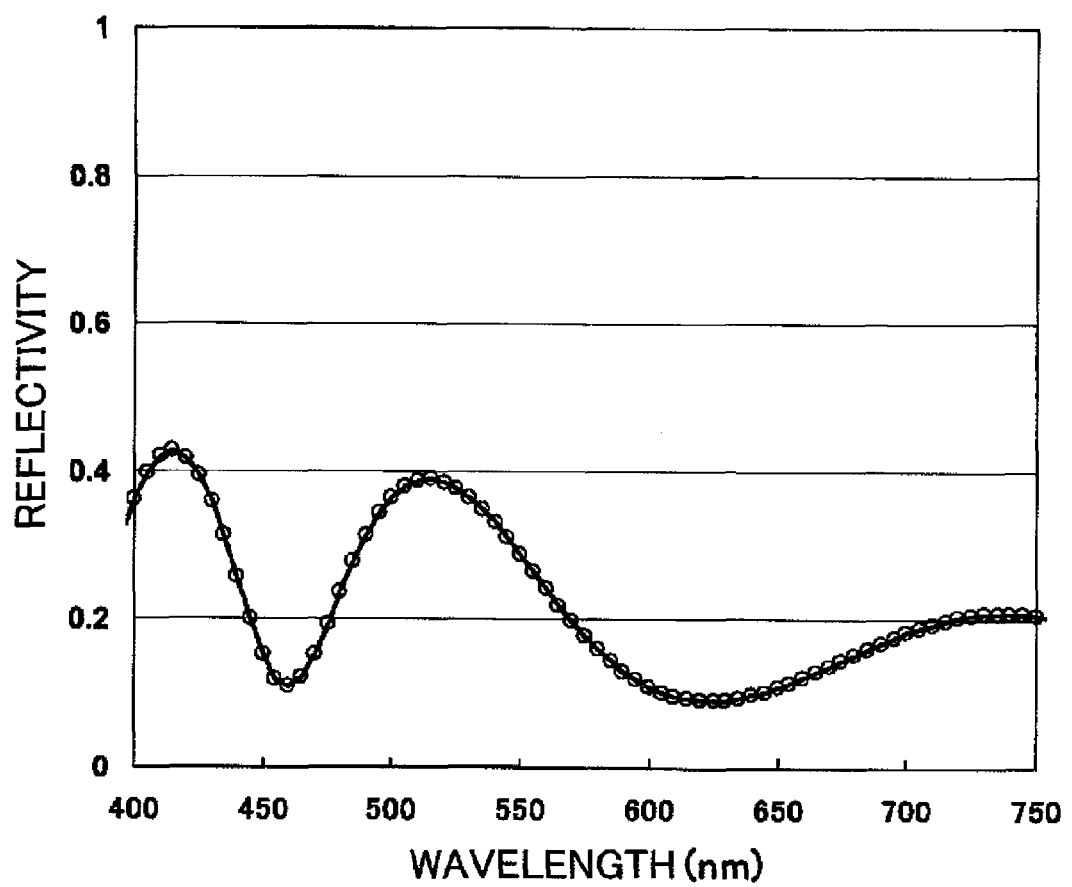
FIG. 2 is a view illustrating the reflectivity characteristic of a dielectric alternate laminated film.

FIG. 2 illustrates the reflectivity of the above dielectric alternate laminated film 17. The film had such a reflectivity characteristic as to show a reflectivity of 43% at 415 nm, a reflectivity of 39% at 515 nm, and a reflectivity of 21% at 730 nm.

Next, a resin layer 18 is formed on the dielectric alternate laminated film 17 so as to cover the dielectric alternate laminated film 17. A microlens sheet 19 is stuck onto the resin layer 18. The microlens sheet 19 functions as the view angle-controlling layer. The resin layer 18 functions as an adhesive for bonding the dielectric alternate laminated film 17 and the microlens sheet 19 (view angle-controlling layer), and a photocurable resin is used in the resin layer 18.

Next, the glass substrate 1 on which the multiple organic luminescent elements have been formed is transferred to a sealing chamber in which a dry nitrogen gas is circulated to keep a high dew point without being exposed to the air.

Next, a counter substrate 20 formed of, for example, a glass substrate is introduced as a sealing substrate into the above sealing chamber. Drawing of a photocurable resin was performed (not illustrated) at an edge portion of the counter substrate 20 with a seal dispenser device.

The counter substrate (sealing substrate) 20 and the glass substrate (OLED substrate) 1 were stuck to, and brought into press contact with, each other in the sealing chamber, and UV light was applied from the side of the counter substrate 20 to cure the photocurable resin.

The constitution of, and the production method for, the color organic luminescent display device were described above.

In this example, in each of the R sub-pixel, the G sub-pixel, and the B sub-pixel, an optical length between the luminescent layer (9, 12, or 14) and the lower electrode (3, 4, or 5) was set to a quarter of a luminous wavelength $\lambda$, and an optical length between the luminescent layer (9, 12, or 14) and an interface between the upper electrode 16 and the dielectric alternate laminated film 17 was set to one half of the $\lambda$. In this case, the optical interference condition in each sub-pixel is optimized. An optical length is a value obtained by multiplying the thickness of a thin film by the refractive index of a material of which the thin film is made.

In addition, the dielectric alternate laminated film 17 had a reflectivity for blue light emission of 43%, a reflectivity for green light emission of 39%, and a reflectivity for red light emission of 21% by virtue of the constitution of the present invention.

A finesse F is represented by (Eq. 1) where $R_2$ represents the reflectivity of a lower electrode and $R_1$ represents the reflectivity of the dielectric alternate laminated film.

$$F = \frac{\pi (R_1 R_2)^{1/4}}{1 - \sqrt{R_1 R_2}} \qquad \text{(Equation 1)}$$

(Eq. 1) showed that finesses in the blue sub-pixel, the green sub-pixel, and the red sub-pixel were as high as 6.6, 5.9, and 3.7, respectively.

As can be seen from the foregoing, the organic luminescent elements in the R sub-pixel, the G sub-pixel, and the B sub-pixel have a radiation pattern that 100% of light beams are extracted at a critical angle of 25° or less, and the extraction efficiency of each organic luminescent element improved by a factor of two.

Next, the directivity of the radiation pattern radiated in a front direction is alleviated by the microlenses and broadened until a perfectly diffusing surface radiation pattern so as to function as an organic luminescent display device.

EXAMPLE 2

Next, Example 2 of the organic luminescent display device according to the present invention is described with reference to FIGS. 3 and 4. FIG. 3 is a sectional view illustrating the sectional structure of a pixel of an organic luminescent display device as Example 2 of the present invention, and FIG. 4 is a view illustrating the energy levels of an organic luminescent element.

It should be noted that, in FIG. 4, reference numeral 30 represents the energy level of a lower electrode, reference numeral 31 represents the energy level of a hole-transporting layer, reference numeral 32 represents the energy level of a host material for an electron-blocking layer, reference numeral 33 represents the energy level of a red dopant, reference numeral 34 represents the energy level of a host material for a luminescent layer, reference numeral 35 represents the energy level of a host material for a hole-blocking layer, reference numeral 36 represents the energy level of an electron-transporting layer, and reference numeral 37 represents the energy level of an upper electrode.

This example relates to a device constitution for reducing a deactivation process by an interaction between a singlet excited state and a polaron which leads to a reduction in efficiency in the light emission process of an organic luminescent element. The constitution can achieve an additional improvement in efficiency.

To be specific, the driver layer 2, the lower electrodes 3 to 5, the interlayer insulating film 6, and the hole-transporting layer 7 are each formed on the glass substrate 1 in the same manner as in Example 1.

Next, the formation of the organic layers in the R sub-pixel is described.

A co-deposited film 21a of α-NPD and $Brp_2Ir(acac)$ having a thickness of about 20 nm is formed on the α-NPD film 7a by a vacuum deposition method. The deposition rate of α-NPD was 0.20 nm/sec and the deposition rate of $Brp_2Ir$ (acac) was 0.001 nm/sec. The co-deposited film 21a functions as an electron-blocking layer 21.

The co-deposited film 9a functioning as the luminescent layer 9 of the organic luminescent element PDR in the R sub-pixel is formed on the film. Conditions for the production of the film are identical to those of Example 1.

A co-deposited film 22a of BCP and Brp$_2$Ir(acac) having a thickness of about 45 nm is formed on the film by a vacuum deposition method. The deposition rate of BCP was 0.20 nm/sec and the deposition rate of Brp$_2$Ir(acac) was 0.001 nm/sec. The co-deposited film 22a functions as a hole-blocking layer 22.

Next, a method of forming the G sub-pixel is described.

A co-deposited film 23a of α-NPD and Ir(ppy)$_3$ having a thickness of about 10 nm is formed on the α-NPD film 7a which functions as the hole-transporting layer 7 by a vacuum deposition method. The deposition rate of α-NPD was 0.20 nm/sec and the deposition rate of Ir(ppy)$_3$ was 0.001 nm/sec. The co-deposited film 23a functions as an electron-blocking layer 23.

The co-deposited film 12a functioning as the luminescent layer 12 of the organic luminescent element PDG in the G sub-pixel is formed on the film. Conditions for the production of the film are identical to those of Example 1.

A co-deposited film 24a of BCP and Brp$_2$Ir(acac) having a thickness of about 20 nm is formed on the film by a vacuum deposition method. The deposition rate of BCP was 0.20 nm/sec and the deposition rate of Ir(ppy)$_3$ was 0.001 nm/sec. The co-deposited film 24a functions as a hole-blocking layer 24.

Next, a method of forming the B sub-pixel is described.

A co-deposited film 25a of α-NPD and TBP having a thickness of about 5 nm is formed on the α-NPD film 7a which functions as the hole-transporting layer 7 by a vacuum deposition method. The deposition rate of α-NPD was 0.20 nm/sec and the deposition rate of TBP was 0.001 nm/sec. The co-deposited film 25a functions as an electron-blocking layer 25.

The co-deposited film 14a functioning as the luminescent layer 14 of the organic luminescent element PDB in the B sub-pixel is formed on the film. The thickness of the co-deposited film 14a was set to 30 nm, and other conditions for the production of the film are identical to those of Example 1.

A co-deposited film 26a of BCP and TBP having a thickness of 5 nm is formed on the film by a vacuum deposition method. The deposition rate of BCP was 0.20 nm/sec and the deposition rate of TBP was 0.001 nm/sec. The co-deposited film 26a functions as a hole-blocking layer 26.

Next, the electron-transporting layer 15, the upper electrode 16, and the dielectric alternate laminated film 17 are each formed in the same manner as in Example 1.

Next, a method of forming the microlens sheet 19 and the sticking of the sheet to the counter substrate are identical to those in Example 1.

In this example, the electron-blocking layer 21 and the hole-blocking layer 22 were provided for the organic luminescent element PDR of the R sub-pixel. α-NPD as a host material for the electron-blocking layer 21 has an electron affinity of 2.4 eV and Brp$_2$Ir(acac) as a dopant material for the layer has an electron affinity of 2.7 eV. An electron affinity is a value for energy to be discharged when one electron is donated to a substance. A method of measuring the electron affinity is, for example, a measurement method involving determining an energy gap from a band end of an absorption spectrum and summing the determined gap and the following ionization potential to determine the electron affinity or inverse photoelectron spectroscopy. Electrons that have propagated through the luminescent layer 9 of the R sub-pixel are trapped by Brp$_2$Ir(acac) having a small electron affinity in the electron-blocking layer 21.

Meanwhile, α-NPD has an ionization potential of 5.4 eV and Brp$_2$Ir(acac) has an ionization potential of 5.4 eV. An ionization potential is a value for energy needed for removing one electron from a substance. A method of measuring the ionization potential is, for example, atmospheric photoelectron spectroscopy or ultraviolet photoelectron spectroscopy. Because α-NPD and Brp$_2$Ir(acac) are substantially identical in ionization potential to each other, holes that have propagated through the hole-blocking layer 22 are caused to propagate through the luminescent layer without being trapped by Brp$_2$Ir(acac).

BCP as a host material for the hole-blocking layer 22 has an ionization potential of 6.4 eV. Accordingly, holes that have propagated through the luminescent layer 9 of the R sub-pixel are trapped by Brp$_2$Ir(acac) in the hole-blocking layer 22. On the other hand, BCP has an electron affinity of 2.9 eV, and hence electrons that have propagated through the hole-blocking layer 22 are caused to propagate through the luminescent layer 9 without being trapped by Brp$_2$Ir(acac).

The electrons that have propagated through the inside of the luminescent layer 9 of the R sub-pixel reside at an interface between the electron-blocking layer 21 and the luminescent layer owing to an energy barrier. Meanwhile, the holes that have propagated through the inside of the luminescent layer 9 reside at an interface between the hole-blocking layer 22 and the luminescent layer owing to an energy barrier. Those electrons and holes recombine in the luminescent layer to interact with singlet excited states, thereby deactivating each of the singlet excited states to the ground state by a non-emission process. In this example, Brp$_2$Ir(acac) as the emitter of the luminescent layer was added in a trace amount to each of the electron-blocking layer 21 and the hole-blocking layer 22. As a result, the electrons present in the luminescent layer 9 are trapped by the electron-blocking layer 21 and the holes present in the luminescent layer are trapped by the hole-blocking layer 22. As a result, a deactivation process between a carrier and a singlet excited state is reduced in the luminescent layer 9.

In the G sub-pixel or the B sub-pixel as well, an electron-blocking layer 23 or 25 and a hole-blocking layer 24 or 26 are formed at both ends of the luminescent layer 12 or 14. Electrons that have penetrated through the luminescent layer 12 or 14 are trapped by the electron-blocking layer 23 or 25, and holes that have penetrated through the luminescent layer 12 or 14 are trapped by the hole-blocking layer 24 or 26. As a result, a deactivation process between a carrier and a singlet excited state is reduced in the luminescent layer 12 or 14. In this example, the electron-blocking layers 21, 23, and 25, and the hole-blocking layers 22, 24, and 26 were each turned into a pattern in each sub-pixel. Alternatively, an approach involving making the electron-blocking layers 21, 23, and 25, and the hole-blocking layers 22, 24, and 26 common to the respective luminescent layers 9, 12, and 14 is also permitted. In that case, a dopant to be added may be a dopant material for each luminescent color, and any material is permitted as long as the material does not trap carriers that have propagated through the luminescent layers 9, 12, and 14.

In this example as well, as in the case of Example 1, the organic luminescent elements in the R sub-pixel, the G sub-pixel, and the B sub-pixel have a radiation pattern that 100% of light beams are extracted at a critical angle of 25° or less. In addition, the increase in the ratio of deactivation between a carrier and a singlet excited state, which is occurred owing to a lengthened lifetime of the singlet excited state, that is caused by a micro-resonator structure was reduced by the constitution of this example, and the efficiency of each organic luminescent element improved by a factor of three.

Next, the directivity of the radiation pattern radiated in a front direction is alleviated by the microlenses and broadened until a perfectly diffusing surface radiation pattern so as to function as an organic luminescent display device.

EXAMPLE 3

Next, Example 3 of the organic luminescent display device according to the present invention is described with reference to FIG. 5. FIG. 5 is a sectional view illustrating the sectional structure of a pixel of an organic luminescent display device as Example 3 of the present invention. In this example, the microlens sheet 19 as a view angle-controlling layer is formed on the counter substrate 20.

To be specific, the driver layer 2, the lower electrodes 3 to 5, the interlayer insulating film 6, the R sub-pixel, the G sub-pixel, the B sub-pixel, the electron-transporting layer 15, and the upper electrode 16 are each formed on the glass substrate 1 in the same manner as in Example 1.

Next, the dielectric alternate laminated film 17 is also formed on the upper electrode 16 under conditions identical to those of Example 1.

Next, the microlens sheet 19 is formed on the upper surface of the counter substrate 20 under conditions identical to those of Example 1.

The counter substrate 20 with the microlens sheet 19 and the glass substrate (OLED substrate) 1 are entirely stuck to each other with a photocurable resin or thermosetting resin.

A total reflection angle is present at an interface between the upper electrode 16 and the resin layer 18 in an ordinary organic luminescent element. In this example, however, a radiation pattern is directed toward a front direction. Accordingly, no total reflection light exists, and light extraction efficiency improves.

Light exited from the counter substrate 20, which is a radiation pattern radiated in a front direction, is alleviated by the microlenses and broadened until a perfectly diffusing surface radiation pattern so as to function as an organic luminescent display device.

In addition, a space between the glass substrate (OLED substrate) 1 on which the organic luminescent elements have been formed and the counter substrate 20 is covered with the resin, and hence the occurrence of a lighting failure of each organic luminescent element caused by a pressing force is reduced.

Although the present invention made by the inventors of the present invention has been specifically described above by way of the examples, the present invention is not limited to the examples, and of course, various modifications can be made as long as the modifications do not deviate from the gist of the invention.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic luminescent display device comprising multiple organic luminescent elements having different luminescent colors so as to emit one of red, green and blue lights, wherein:
the organic luminescent elements each have
a lower electrode,
an upper electrode provided on the lower electrode, and
a luminescent layer provided between the lower electrode and the upper electrode;
wherein a dielectric alternate laminated film obtained by alternately laminating dielectric films made of at least two kinds of materials is provided on the upper electrode of the multiple organic luminescent elements;
wherein a view angle-controlling layer is provided on the dielectric alternate laminated film;
wherein the dielectric alternate laminated film include a dielectric film made of a first dielectric material and another dielectric film made of a second dielectric material having a lower refractive index than a refractive index of the first dielectric material; and
wherein the dielectric alternate laminated film has
at least one first laminated film obtained by superimposing a layer made of the first dielectric material having an optical length equal to a quarter of a center wavelength $\lambda_G$ of green light emission and a layer made of the second dielectric material having an optical length equal to a quarter of the center wavelength $\lambda_G$ of the green light emission, and
at least one second laminated film obtained by superimposing a layer made of a third dielectric material having one of an optical length equal to a center wavelength $\lambda_B$ of blue light emission and an optical length equal to three quarters of a center wavelength $\lambda_R$ of red light emission, and a layer made of a fourth dielectric material having one of an optical length equal to three quarters of the center wavelength $\lambda_B$ of the blue light emission and an optical length equal to one half of the center wavelength $\lambda_R$ of the red light emission.

2. An organic luminescent display device according to claim 1, wherein:
the lower electrode has a function of reflecting light emitted from the luminescent layer; and
the upper electrode has a function of transmitting the light emitted from the luminescent layer.

3. An organic luminescent display device according to claim 1, wherein:
the organic luminescent elements each further have an electron-blocking layer and a hole-blocking layer formed so as to sandwich the luminescent layer;
the luminescent layer comprises a host material and an emitter that determines a luminescent color are added; and
the electron-blocking layer is made of a hole-transporting material and a first dopant, and the hole-blocking layer is made of an electron-transporting material and a second dopant.

4. An organic luminescent display device according to claim 1, wherein the view angle-controlling layer is formed of multiple microlenses.

5. An organic luminescent display device according to claim 1, wherein an adhesive is provided between the dielectric alternate laminated film and the view angle-controlling layer.

6. An organic luminescent display device according to claim 5, wherein the adhesive comprises a photocurable resin.

7. An organic luminescent display device according to claim 1, wherein:
the organic luminescent elements are formed on a first substrate; and
the view angle-controlling layer is formed on a second substrate different from the first substrate.

8. An organic luminescent display device according to claim 1, wherein the dielectric alternate laminated film has a high reflectivity for a center wavelength in each of the luminescent colors.

9. An organic luminescent display device comprising multiple organic luminescent elements having different luminescent colors so as to emit one of red, green and blue lights, wherein:
the organic luminescent elements each have
a lower electrode,
an upper electrode provided on the lower electrode, and
a luminescent layer provided between the lower electrode and the upper electrode;
wherein a dielectric alternate laminated film obtained by alternately laminating dielectric films made of at least two kinds of materials is provided on the upper electrode of the multiple organic luminescent elements;
wherein a view angle-controlling layer is provided on the dielectric alternate laminated film; and
wherein a micro-resonator structure formed of the lower electrode and the dielectric alternate laminated film has a finesse in a range of 3.7 or more to 7 or less.

10. An organic luminescent display device according to claim 9, wherein the dielectric alternate laminated film has a high reflectivity for a center wavelength in each of the luminescent colors.

11. An organic luminescent display device comprising multiple organic luminescent elements having different luminescent colors so as to emit one of red, green and blue lights, wherein:
the organic luminescent elements each have
a lower electrode,
an upper electrode provided on the lower electrode, and
a luminescent layer provided between the lower electrode and the upper electrode;
wherein a dielectric alternate laminated film obtained by alternately laminating dielectric films made of at least two kinds of materials is provided on the upper electrode of the multiple organic luminescent elements;
wherein a view angle-controlling layer is provided on the dielectric alternate laminated film;
wherein the organic luminescent elements each further have an electron-blocking layer and a hole-blocking layer formed so as to sandwich the luminescent layer;
wherein the luminescent layer comprises a host material and an emitter that determines a luminescent color are added;
wherein the electron-blocking layer is made of a hole-transporting material and a first dopant, and the hole-blocking layer is made of an electron-transporting material and a second dopant;
wherein a difference between an ionization potential of the hole-transporting material of which the electron-blocking layer is made and an ionization potential of the first dopant is 0.1 eV or less;
wherein a difference between an electron affinity of the first dopant and an electron affinity of the hole-transporting material is 0.1 eV or more;
wherein a difference between an ionization potential of the electron-transporting material of which the hole-blocking layer is made and an ionization potential of the second dopant is 0.1 eV or more; and
wherein a difference between an electron affinity of the electron-transporting material and an electron affinity of the second dopant is 0.1 eV or more.

12. An organic luminescent display device according to claim 11, wherein the dielectric alternate laminated film has a high reflectivity for a center wavelength in each of the luminescent colors.

* * * * *